United States Patent
Kim et al.

(10) Patent No.: US 12,003,028 B2
(45) Date of Patent: Jun. 4, 2024

(54) PHASED ARRAY ANTENNA MODULE AND MOBILE DEVICE INCLUDING SAME

(71) Applicant: Industrial Cooperation Foundation Jeonbuk Ntl Univ, Jeonju-si (KR)

(72) Inventors: Jung Mu Kim, Jeonju-si (KR); Hae Won Son, Jeonju-si (KR); Dong Gu Im, Jeonju-si (KR)

(73) Assignee: Jeonbuk National University, Jeonju-si (KR)

( * ) Notice: Subject to any disclaimer, the term of this patent is extended or adjusted under 35 U.S.C. 154(b) by 0 days.

(21) Appl. No.: 17/814,851

(22) Filed: Jul. 26, 2022

(65) Prior Publication Data

US 2023/0025657 A1    Jan. 26, 2023

Related U.S. Application Data

(63) Continuation of application No. PCT/KR2020/015997, filed on Nov. 13, 2020.

(30) Foreign Application Priority Data

Feb. 28, 2020 (KR) .................. 10-2020-0024842

(51) Int. Cl.
*H01Q 21/06*  (2006.01)
*H01Q 13/02*  (2006.01)
*H01Q 15/12*  (2006.01)

(52) U.S. Cl.
CPC ....... *H01Q 21/061* (2013.01); *H01Q 13/0233* (2013.01); *H01Q 15/12* (2013.01)

(58) Field of Classification Search
CPC .. H01Q 21/061; H01Q 13/0233; H01Q 15/12; H01Q 9/0457
See application file for complete search history.

(56) References Cited

U.S. PATENT DOCUMENTS 8,649,833 B1 * 2/2014 Lee .................. H04M 1/026
                                                    455/82
8,971,826 B2   3/2015 Abdul-Gaffoor
(Continued)

FOREIGN PATENT DOCUMENTS

KR    10-1900174 B1    9/2018
KR   10-2019-0086596 A  7/2019
WO     2012066838 A1    5/2012

OTHER PUBLICATIONS

Mohammed R. Abdul-Gaffoor, Certificate of Correction, Mar. 3, 2015, 8971826X6, United States of America.
(Continued)

*Primary Examiner* — Ricardo I Magallanes
*Assistant Examiner* — Jordan E. DeWitt
(74) *Attorney, Agent, or Firm* — Sisson & Banyas, Attorneys at Law, LLC; Edwin A. Sisson (57) ABSTRACT

The present disclosure relates to a phased array antenna module. The phased array antenna module comprises: multiple antenna units, each of which comprises a first antenna electrode part, a second antenna electrode part spaced apart from the first antenna electrode part, a sensing electrode part electrically connected to the second antenna electrode part, and a ground electrode part spaced apart from the first antenna electrode part with the second antenna electrode part interposed therebetween; a capacitance sensing part to which the sensing electrode part is connected and which senses at least one among the capacitance change between the first antenna electrode part and the second antenna electrode part, the capacitance change between the first antenna electrode part and the ground electrode part, and the capacitance change between the second antenna electrode part and the ground electrode part, and outputs a capacitance sensing signal; and a module control part which is electrically connected to the capacitance sensing part and the (Continued)

second antenna electrode part of each of the antenna units, and controls the antenna units on the basis of the capacitance sensing signal generated by the capacitance sensing part.

20 Claims, 7 Drawing Sheets (56) References Cited

U.S. PATENT DOCUMENTS

| | | | | |
|---|---|---|---|---|
| 9,215,302 | B2* | 12/2015 | Thorson | G06F 1/1626 |
| 9,325,080 | B2* | 4/2016 | Ouyang | H01Q 5/35 |
| 9,374,119 | B1* | 6/2016 | Chou | H04B 1/3838 |
| 9,502,768 | B2* | 11/2016 | Huang | H01Q 1/44 |
| 9,864,464 | B2* | 1/2018 | Rouaissia | G06F 3/04182 |
| 10,224,974 | B2 | 3/2019 | Mercer | |
| 10,374,315 | B2* | 8/2019 | Pance | H01Q 1/36 |
| 10,797,385 | B2* | 10/2020 | Yu | H01Q 9/42 |
| 11,191,035 | B2* | 11/2021 | Liu | H04B 1/3838 |
| 11,329,374 | B2* | 5/2022 | Li | H01Q 5/371 |
| 2004/0201527 | A1* | 10/2004 | Hani | H01Q 5/371 |
| | | | | 343/702 |
| 2009/0021446 | A1* | 1/2009 | Kataya | H05K 1/141 |
| | | | | 343/866 |
| 2012/0071203 | A1* | 3/2012 | Wong | H04M 1/724 |
| | | | | 455/550.1 |
| 2013/0083439 | A1* | 4/2013 | Hayakawa | H02H 9/045 |
| | | | | 361/56 |
| 2013/0130633 | A1* | 5/2013 | Lin | H01Q 1/245 |
| | | | | 343/866 |
| 2013/0156080 | A1* | 6/2013 | Cheng | H04M 1/72454 |
| | | | | 375/267 |
| 2013/0241796 | A1* | 9/2013 | Nagumo | H04B 1/0458 |
| | | | | 343/861 |
| 2014/0315606 | A1 | 10/2014 | You | |
| 2015/0171916 | A1* | 6/2015 | Asrani | H04M 1/0202 |
| | | | | 455/575.7 |
| 2015/0295318 | A1* | 10/2015 | Chiu | H01Q 1/245 |
| | | | | 343/745 |
| 2015/0340757 | A1* | 11/2015 | Rho | H01Q 5/342 |
| | | | | 343/702 |
| 2016/0087343 | A1* | 3/2016 | Chang | H01Q 5/378 |
| | | | | 343/720 |
| 2016/0197396 | A1* | 7/2016 | Choi | H01Q 5/314 |
| | | | | 343/702 |
| 2017/0084989 | A1* | 3/2017 | Shi | H01Q 1/243 |
| 2017/0277321 | A1* | 9/2017 | Ding | G02F 1/136286 |
| 2017/0310298 | A1* | 10/2017 | Nagumo | H01Q 9/42 |
| 2018/0026364 | A1* | 1/2018 | Chou | H01Q 3/24 |
| | | | | 343/757 |
| 2019/0097316 | A1* | 3/2019 | Cruise | G01R 27/2605 |
| 2021/0175609 | A1* | 6/2021 | Ryoo | H01Q 1/2283 |
| 2022/0069451 | A1* | 3/2022 | Chang | H01Q 5/378 |
| 2022/0069453 | A1* | 3/2022 | Yun | H04B 3/52 |
| 2023/0361467 | A1* | 11/2023 | Wu | H01Q 5/40 |

OTHER PUBLICATIONS

European Patent Office, Extended European search report, Feb. 6, 2024, EP-21136370, Munich Germany.

* cited by examiner

PHASED ARRAY ANTENNA MODULE AND MOBILE DEVICE INCLUDING SAME

PRIORITIES AND CROSS REFERENCES

This Application claims priority from International Application No. PCT/KR2020/015997 filed on 13 Nov. 2020 and Republic of Korean Application No. 10-2020-0024842 filed on 28 Feb. 2020 the teachings of each of which are incorporated by reference herein in their entirety.

TECHNICAL FIELD

The present disclosure relates to a phased array antenna module and a mobile device including the same.

BACKGROUND ART

There is a problem in that when antennas of communication terminals touch hands or obstacles, impedance mismatch occurs and the transmission/reception sensitivity decreases.

Accordingly, some conventional communication terminals measure antenna impedance through an impedance matching circuit and compensate for the antenna impedance mismatch, so that the communication devices may obtain optimal transmission/reception sensitivity.

However, it is difficult for communication terminals that support an ultra-high frequency band propagation such as millimeter wave (mmWave) to accurately measure an impedance compared to a relatively low frequency band, and a lot of time and an expensive design are required to compensate for the antenna impedance mismatch for obtaining the optimal transmission/reception sensitivity of the antenna obscured by grips and obstacles.

SUMMARY OF INVENTION

Technical Problem

Accordingly, an object of the present disclosure is to provide a phased array antenna for easily identifying and compensating for a reduction in transmission/reception sensitivity of an antenna, and a mobile device including the same.

Solution to Problem

One aspect of an embodiment of the present disclosure provides a phased array antenna module including: a plurality of antenna units including a first antenna electrode part, a second antenna electrode part spaced apart from the first antenna electrode part, a sensing electrode part electrically connected to the second antenna electrode part, and a ground electrode part spaced apart from the first antenna electrode part with the second antenna electrode part interposed therebetween; a capacitance sensing part connected to the sensing electrode part to output a capacitance sensing signal by detecting at least one of a capacitance change between the first antenna electrode part and the second antenna electrode part, a capacitance change between the first antenna electrode part and the ground electrode part, and a capacitance change between the second antenna electrode part and the ground electrode part; and a module control unit electrically connected to the capacitance sensing part and the second antenna electrode part of the antenna unit, and configured to control the antenna units based on the capacitance sensing signal generated from the capacitance sensing part.

In addition, the sensing electrode part may include: a filtering unit electrically connected to the second antenna electrode part to block a first signal of a high frequency signal, and pass a second signal of a low frequency signal; and a sensing electrode unit electrically connected to the filtering unit and the capacitance sensing part, and configured to transmit the second signal.

In addition, the filtering unit may be an RF choke.

In addition, the antenna unit may include an insulating unit disposed between the first antenna electrode part and the second antenna electrode part, and the first antenna electrode part may be disposed on an upper surface of the insulating unit, a recess area recessed upward from the insulating unit may be formed on a lower surface of the insulating unit, and the thickness of the insulating unit may be formed to be the smallest at a center of the recess area and may be increased from the center of the recess area toward an edge of the recess area.

In addition, the second antenna electrode part may include a transmission/reception area that transmits and receives the first signal and the second signal to and from the first antenna electrode part, and vertically overlap the first antenna electrode part, and a signal transmission area electrically connected to the sensing electrode part and the module control part to transmit the first signal and the second signal, the second signal may be transmitted toward the sensing electrode part through a node at which the sensing electrode part and the signal transmission area are connected, and the recess area may be disposed between the first antenna electrode part and the second antenna electrode part.

In addition, the first antenna electrode part may be formed to have an area larger than that of the transmission/reception area of the second antenna electrode part, and the first antenna electrode part may fully cover the transmission/reception area of the second antenna electrode part.

In addition, the antenna unit may further include a substrate having the ground electrode part formed on an upper surface, an insulating layer disposed above the ground electrode part, and a support unit disposed between the insulating layer and the insulating unit and configured to support the insulating unit with respect to the insulating layer, the support unit may be formed so that the insulating unit is spaced apart from the upper surface of the insulating layer, and the transmission/reception area may be surrounded by the support unit.

In addition, the second antenna electrode part and the sensing electrode part may be formed on the upper surface of the insulating layer, and the support unit may cover a part of the second antenna electrode part.

In addition, the transmission/reception area of the second antenna electrode part may be formed in a bent shape upward more than other areas of the second antenna electrode part other than the transmission/reception area, an additional insulating area may be formed between the transmission/reception area of the second antenna electrode part and the insulating layer, the transmission/reception area of the second antenna electrode part may be spaced apart from the recessed lower surface of the insulating unit in a state of being positioned within the recess area of the insulating unit, and a dielectric constant of the additional insulating area may be lower than a dielectric constant of the second antenna electrode part.

In addition, the additional insulating area may be an air gap configured to separate the transmission/reception area from the insulating layer.

In addition, the ground electrode part may include a ground electrode unit that passes through the insulating layer at one end of the ground electrode part to have an end exposed to the upper surface of the insulating layer.

In addition, the insulating layer may include a first sub-insulating layer disposed on an upper surface of the ground electrode part, and having the transmission/reception area of the second antenna electrode part disposed on an upper surface, and a second sub-insulating layer disposed on an upper surface of the transmission/reception area, the signal transmission area of the second antenna electrode part may be disposed on an upper surface of the second sub-insulating layer, the phased array antenna module may further include a second antenna electrode part side bent area formed to be bent in a shape of passing through the second sub-insulating layer at an end of the signal transmission area of the second antenna electrode part and connected to the transmission/reception area, and the ground electrode part may further include a sub-ground electrode vertically overlapping the transmission/reception area of the second antenna electrode part disposed between the first sub-insulating layer and the second sub-insulating layer in a state of being disposed on the upper surface of the second sub-insulating layer, and formed with a through hole, and a part of the second sub-insulating layer may be exposed upward through the through hole.

In addition, the ground electrode part may further include a connection line connecting the sub-ground electrode and a main ground electrode of the ground electrode part by passing through the first sub-insulating layer and the second sub-insulating layer.

In addition, the antenna unit may further include an insulating substrate disposed above the ground electrode part, and a support unit disposed between the insulating substrate and the insulating unit and configured to support the insulating unit with respect to the insulating substrate, and the support unit may be formed so that the insulating unit is spaced apart from the upper surface of the insulating substrate, the transmission/reception area may be surrounded by the support unit, and the thickness of the insulating substrate may be 250 um to 500 um.

In addition, the capacitance sensing part may detect at least one among a capacitance change between the first antenna electrode part and the second antenna electrode part, and capacitance changes between the first antenna electrode part and the ground electrode part and between the second antenna electrode part and the ground electrode part by identifying a time at which a current source charges a capacitor and the charged voltage reaches a specific reference voltage based on the second signal formed as a current signal, and the second signal may be periodically transmitted to the capacitance sensing part.

In addition, the capacitance sensing part may detect at least one among a capacitance change between the first antenna electrode part and the second antenna electrode part, and capacitance changes between the first antenna electrode part and the ground electrode part and between the second antenna electrode part and the ground electrode part by applying a reference voltage signal to a charge amplifier non-inverted terminal and identifying the magnitude of a charge amplifier output signal based on the second signal formed as a voltage signal, and the second signal may be periodically transmitted to the capacitance sensing part.

In addition, the module control unit may deactivate the corresponding antenna unit when a capacitance value measured by the capacitance sensing part of any one or one or more antenna units is different from a reference capacitance value based on the capacitance sensing signal received from a plurality of antenna units.

Another aspect of the embodiment of the present disclosure provides a mobile device including: a body part forming an external shape; and a plurality of phased array antenna modules disposed inside the body part and including a first antenna electrode part, a second antenna electrode part spaced apart from the first antenna electrode part, a sensing electrode part electrically connected to the second antenna electrode part, a plurality of antenna units including a ground electrode part spaced apart from the first antenna electrode part with the second antenna electrode part interposed therebetween, a capacitance sensing part connected to the sensing electrode part to output a capacitance sensing signal by detecting at least one among a capacitance change between the first antenna electrode part and the second antenna electrode part, a capacitance change between the first antenna electrode part and the ground electrode part, and a capacitance change between the second antenna electrode part and the ground electrode part, and a module control part electrically connected to the capacitance sensing apart and the second antenna electrode part of the antenna unit, and configured to control the antenna units based on the capacitance sensing signal generated from the sensing part, in which the phased array antenna modules are disposed to be spaced apart from each other at different positions of the body part.

In addition, the mobile device may further include: an integrated control part electrically connected to the module control part to control the amount of the power consumption of a transceiver connected to the phased array antenna modules, the module control part may generate an activation signal for determining the number of activated antenna units among the antenna units, and the integrated control part may receive the activation signal generated from the module control part, and control the amount of the power consumption of the transceiver connected to the phased array antenna modules based on the activation signal.

Advantageous Effects of Invention

According to the proposed embodiments, even when the antenna disposed in the terminal may not be impedance matched due to obstacles or the antenna signal is not radiated, it is possible to select the optimal antenna array and adjust the magnitude of the output based on the output of the sensor, and obtain the optimal transmission/reception sensitivity by changing the output matching circuit.

DESCRIPTION OF EMBODIMENTS

Advantages and features of the present disclosure and methods of achieving them will be made clear from embodiments described in detail below with reference to the accompanying drawings. However, the present disclosure is not limited to embodiments disclosed below but will be implemented in various different forms, and only these embodiments are provided so that the disclosure of the present disclosure will be thorough and complete and will fully convey the scope of the present disclosure to those skilled in the art to which the present disclosure pertains, and the present disclosure is defined by the description of the claims.

Although the first, second, and the like are used to describe various components, it goes without saying that these components are not limited by these terms. These terms are only used to distinguish one component from another. Accordingly, it goes without saying that the first component mentioned below may also be the second component within the technical spirit of the present disclosure.

The same reference numerals refer to the same components throughout the specification.

Each feature of various embodiments of the present disclosure may be partially or wholly coupled or combined with each other, and as may be understood by those skilled in the art, technically various interlocking and driving are possible, and each embodiment may also be implemented independently of each other and may also be embodied together in a related relationship.

Meanwhile, the potential effects that may be expected by the technical features of the present disclosure not specifically mentioned in the specification of the present disclosure are treated as described in this specification, and this embodiment is provided to more fully describe the present disclosure for those skilled in the art, and thus the contents shown in the drawings may be exaggerated compared to the actual implementation of the present disclosure, and a detailed description of the configuration determined to unnecessarily obscure the gist of the present disclosure will be omitted or briefly described.

Hereinafter, embodiments of the present disclosure will be described in detail with reference to the accompanying drawings.

Figure 1:
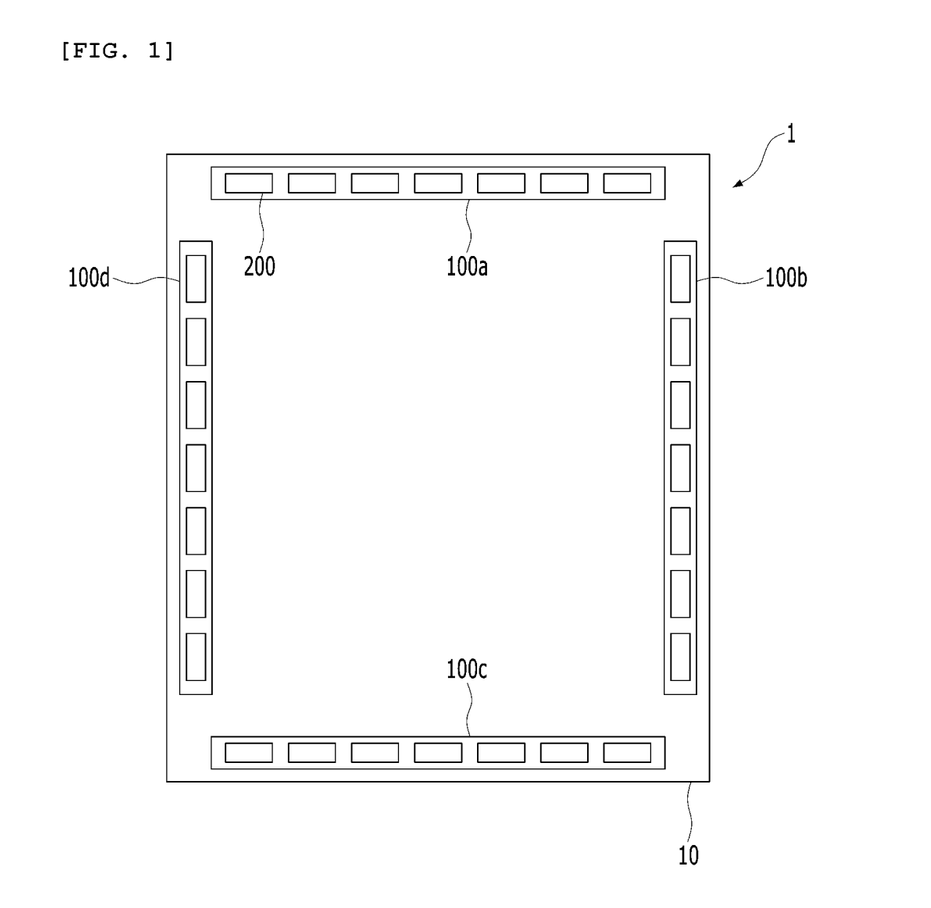
FIG. 1 is a view showing a mobile device including a plurality of phased array antennas according to an embodiment of the present disclosure.

FIG. 1 is a view showing a mobile device including a plurality of phased array antennas according to an embodiment of the present disclosure.

Referring to FIG. 1, a mobile device 1 according to an embodiment of the present disclosure has a plurality of phased array antenna modules 100a, 100b, 100c, and 100d installed at different positions of a body of the mobile device. In addition, when the reception sensitivity of any one or more of the phased array antenna modules 100a, 100b, 100c, and 100d is reduced due to a phenomenon such as a hand grip, the mobile device 1 may reduce the reception sensitivity phenomenon by identifying the reduction in reception sensitivity based on the capacitance change of an antenna unit 200 included in the phased array antenna modules 100a, 100b, 100c, and 100d, and controlling the specific antenna unit 200 or the phased array antenna modules 100a, 100b, 100c, and 100d. Hereinafter, the phased array antenna modules 100a, 100b, 100c, and 100d according to the embodiment of the present disclosure and a configuration of the mobile device 1 including the same will be described in detail.

The mobile device 1 according to this embodiment includes the plurality of phased array antenna modules 100a, 100b, 100c, and 100d.

The plurality of phased array antenna modules 100a, 100b, 100c, and 100d are included in the mobile device so that communication with a communication unit included in the mobile device 1 and a base station is possible.

At this time, the plurality of phased array antenna modules 100a, 100b, 100c, and 100d may be disposed to be spaced apart from each other at different positions of a body part 10 forming an outer shape of the mobile device 1, and spaced apart from each other in a range without signal interference between the phased array antenna modules 100a, 100b, 100c, and 100d and disposed in the mobile device 1 without limitation in number.

In addition, although limited to the mobile device 1 in this embodiment, the phased array antenna module 100 may be installed in an apparatus including a display, a communication available module, and a touchable sensing module.

Meanwhile, the phased array antenna modules 100a, 100b, 100c, and 100d include a plurality of antenna units 200 to be described later. The plurality of antenna units 200 may be disposed in one of the phased array antenna modules 100a, 100b, 100c, and 100d, any one antenna unit 200 may be disposed to be spaced apart from another adjacent antenna unit 200, and the plurality of antenna units 200 installed in one of the phased array antenna modules 100a, 100b, 100c, and 100d may be disposed linearly. The configuration in which the plurality of antenna units 200 are linearly disposed is only an exemplary configuration, and the phased array antenna modules 100a, 100b, 100c, and 100d are formed in a square shape, and a configuration in which the antenna unit 200 is formed with respect to two axes (X axis, Y-axis) or disposed in a radial shape is also included in the embodiment of the present disclosure.

Figure 2:
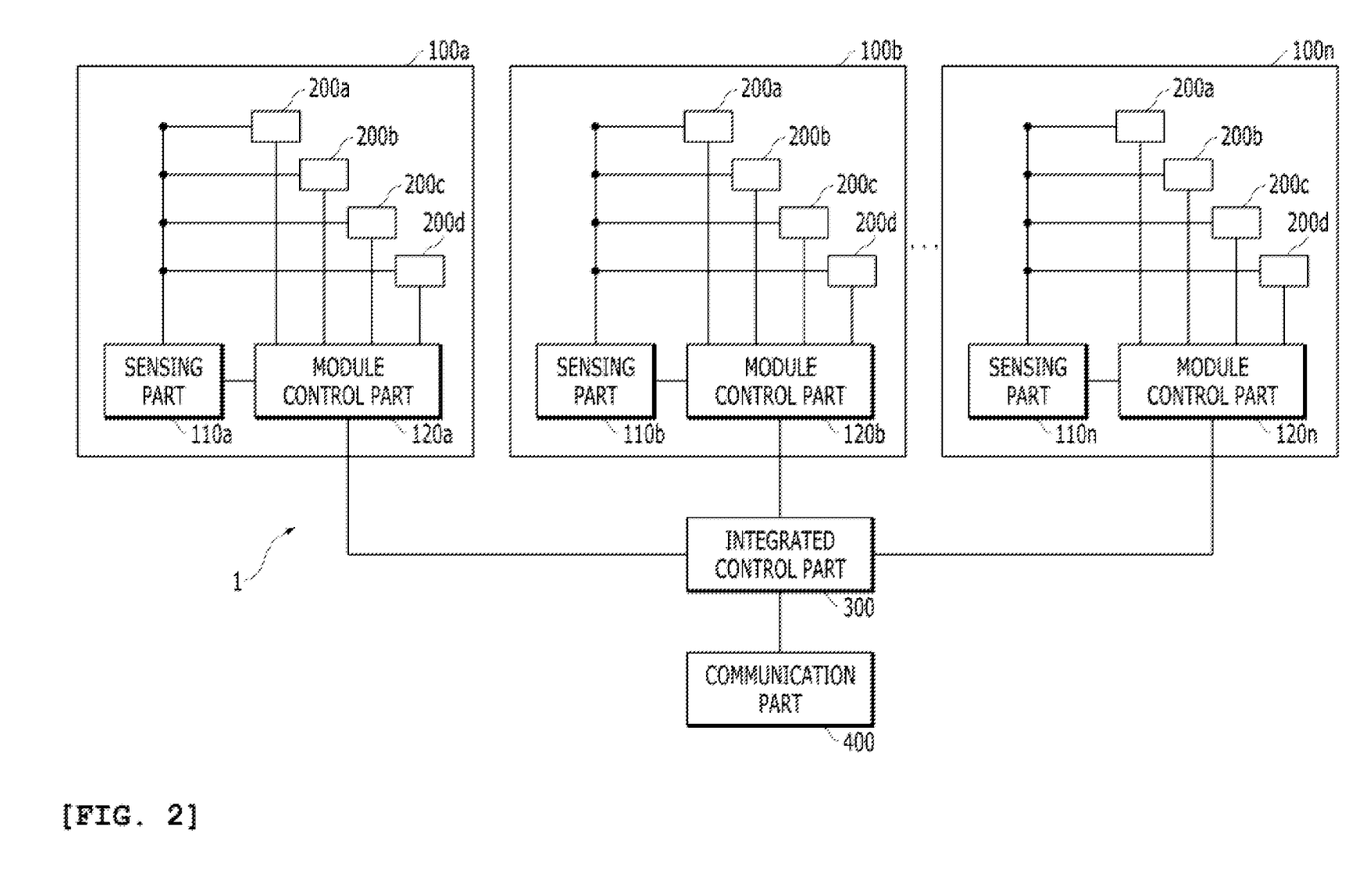
FIG. 2 is a block view showing a configuration of the mobile device in FIG. 1.
Figure 3:
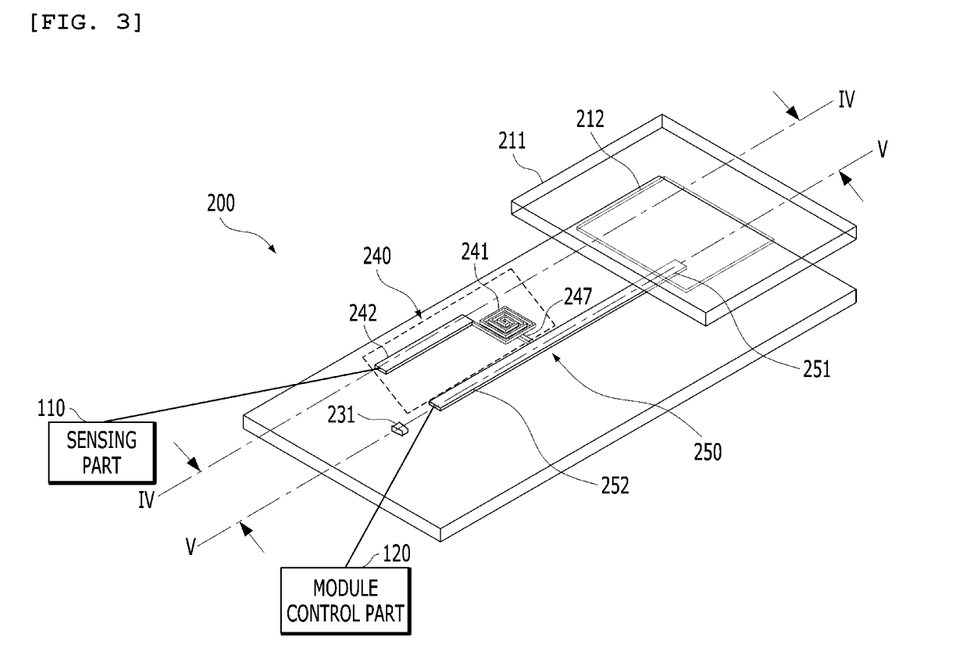
FIG. 3 is a view showing an antenna module in FIG. 2.

FIG. 2 is a block view showing a configuration of the mobile device in FIG. 1. FIG. 3 is a view showing an antenna module in FIG. 2.

First, referring to FIG. 2, the mobile device 1 includes the body part 10, a plurality of phased array antenna modules 100a, 100b, and 100n, an integrated control part 300, and a communication part 400.

More specifically, the phased array antenna modules 100a, 100b, and 100n may include antenna units 200a, 200b, 200c, and 200d, capacitance sensing parts 110a, 110b, and 110n, and module control parts 120a, 120b, and 120n.

The antenna units 200a, 200b, 200c, and 200d may receive a first signal $S_1$ having a high frequency and a second signal $S_2$ having a relatively low frequency compared to the first signal $S_1$ from the outside to transmit the first and second signals to the capacitance sensing parts 110a, 110b, and 110n and the module control parts 120a, 120b, and 120n.

At this time, the first signal $S_1$ may be a signal of a high frequency or ultra-high frequency band generated by any other wireless protocols designated as not only IEEE 802.11, code division multiple access (CDMA), time division multiple access (TDMA), digital enhanced cordless telecommunications (DECT), long term evolution (LTE), Zigbee, near field communication (NFC), radio frequency (RF), Bluetooth but also 3G, 4G, 5G and more, and the second signal $S_2$ may be a signal of a low frequency band generated by the capacitance change between electrodes. For example, the first signal $S_1$ may be a high-frequency signal of a 28 GHz band.

In addition, the antenna units 200a, 200b, 200c, and 200d may transmit a communication signal generated by the communication part 400 included in the mobile device 1 to the outside.

The module control parts 120a, 120b, and 120n may be electrically connected to the capacitance sensing parts 110a, 110b, and 110n and a second antenna electrode part 250 of the antenna units 200a, 200b, 200c, and 200d, and control the antenna units 200a, 200b, 200c, and 200d based on a capacitance sensing signal $S_c$ generated from the capacitance sensing parts 110a, 110b, and 110n.

More specifically, the module control part 120 may correct the first signal $S_1$ received from the plurality of antenna units 200a, 200b, 200c, and 200d by controlling the phase shift, and signal and power amplification of the signals received from the antenna units 200a, 200b, 200c, and 200d and the communication part 400 based on the generated capacitance sensing signal Sc.

At this time, the capacitance sensing signal $S_c$ is a signal for determining whether the antenna units 200a, 200b, 200c, and 200d touch the outside based on the signal output by detecting the capacitance change of the capacitance sensing parts 110a, 110b, and 110n.

The module control parts 120a, 120b, and 120n may deactivate the corresponding antenna units 200a, 200b, 200c, and 200d when capacitance values measured by the capacitance sensing parts 110a, 110b, and 110n of any one or one or more antenna units 200 are different from a reference capacitance value based on the capacitance sensing signal $S_c$ received from the plurality of capacitance sensing parts 110a, 110b, and 110n.

In other words, when the antenna unit 200 touches an obstacle, the phased array antenna modules 100a, 100b, and 100n according to the embodiment of the present disclosure deactivate the corresponding antenna unit 200 by recognizing the touch according to a change in the capacitance value, and amplify the transmitted and received signals of the antenna units 200 not touched by the obstacle, so that there is an advantage in that it is possible to optimize the efficiency of the phased array antenna module 100. In addition, the mobile device 100 according to the embodiment of the present disclosure may further include the integrated control part 300 configured to control the phased array antenna modules 100a, 100b, and 100n, and when the phenomenon in which the entire reception sensitivity of the antenna units 200 of any one of the phased array antenna modules 100a, 100b, and 100n is reduced occurs, the integrated control part 300 may deactivate the corresponding phased array antenna modules 100a, 100b, and 100n. At this time, the integrated control part 300 controls the amount of power consumption of transceivers connected to the phased array antenna modules 100a, 100b, and 100n.

At this time, the reference capacitance value may be a value measured based on at least one of a capacitance value between a first antenna electrode part 212 and the second antenna electrode part 250 of the antenna unit 200, a capacitance value between the first antenna electrode part 212 and a ground electrode part 230, and a capacitance value between the second antenna electrode part 250 and the ground electrode part 230 in normal states of the antenna units 200a, 200b, 200c, and 200d, that is, in a non-touch state in which a separate obstacle does not touch the first antenna electrode part 212. In other words, the entire amount of the capacitance change for the antenna unit 200 may be measured by a capacitance change between the first antenna electrode part 212 and the second antenna electrode part 250, a capacitance change between the first antenna electrode part 212 and the ground electrode part 230, and a capacitance change between the second antenna electrode part 250 and the ground electrode part 230.

More specifically, the reference capacitance value may be a value detected and synthesized through at least one of the first antenna electrode part 212, the second antenna electrode part 250, the first antenna electrode part 212 and the ground electrode part 230, and the second antenna electrode part 250 and the ground electrode part 230 using the reference signal applied to the antenna units 200a, 200b, 200c, and 200d. At this time, the reference signal may be applied according to a preset sensing reference period, and the reference signal may be linearly increased, for example, from 0 V to a preset reference voltage in one period.

Meanwhile, when one or more antenna units 200 touch the obstacle such as a part of the user's body, at least one of the capacitance value between the first antenna electrode part 212 and the second antenna electrode part 250 of the antenna unit 200, the capacitance value between the first antenna electrode part 212 and the ground electrode part 230, and the capacitance value between the second antenna electrode part 250 and the ground electrode part 230 may be changed, and for example, the capacitance values measured by the capacitance sensing parts 110a, 110b, and 110n may be increased.

When the capacitance value is increased, a time at which the reference signal applied to the antenna unit 200 reaches a reference voltage from 0 V is increased. In other words, a time constant is determined by a resistance and a capacitance value, and the capacitance sensing parts 110a, 110b, and 110n according to this embodiment may detect the amount of capacitance change or the magnitude of the capacitance based on the increased time.

When the magnitude of the detected capacitance value is different from the reference capacitance value, for example, when the magnitude of the detected capacitance value is greater than the reference capacitance value, the capacitance sensing parts 110a, 110b, and 110n transmit the capacitance sensing signal $S_c$ that is information on any one of the antenna units 200, which has the changed capacitance value toward the module control unit 120.

In other words, the capacitance sensing part 110 detects the capacitance change of the antenna unit 100 including at least one among the capacitance changes between the first antenna electrode part 212 and the second antenna electrode part 250, between the first antenna electrode part 212 and the ground electrode part 230, and between the second antenna electrode part 250 and the ground electrode part 230 by identifying the time at which a current source charges the capacitor and the charged voltage reaches a specific reference voltage based on the second signal $S_2$ formed as a current signal. At this time, the second signal $S_2$ is periodically transmitted toward the capacitance sensing part 110.

The module control part 120 may deactivate the antenna unit 200 in which the capacitance value is changed, that is, the antenna unit 200 in which the hand grip occurs, based on the capacitance sensing signal Sc.

Meanwhile, the integrated control part 300 may selectively deactivate the outputs of any one or one or more of the phased array antenna modules 100a, 100b, and 100n based on activation signals SA received from the plurality of phased array antenna modules 100a, 100b, and 100n. At this time, the activation signal SA is a signal for determining the number of antenna units 200 activated by the module control part 120 of the phased array antenna modules 100a, 100b, and 100n.

For example, when it is determined that 50% or more of the antenna units 200 among the plurality of antenna units 200 included in one of the phased array antenna module 100a, 100b, and 100n are deactivated by the activation signal SA, the integrated control part 300 deactivates the corresponding phased array antenna modules 100a, 100b, and 100n. However, the above rate is only an exemplary configuration, and a configuration formed by 50% or more or 50% or less is also included in the embodiment of the present disclosure.

In addition, when the output of at least one of the phased array antenna modules 100a, 100b, and 100n is deactivated, the integrated control part 300 amplifies the outputs of the other non-activated phased array antenna modules 100a, 100b, and 100n.

The integrated control unit 300 amplifies the output of the phased array antenna module activated by the deactivated phased array antenna module, so that there is an advantage in that it is possible to implement the maximum transmission/reception efficiency by adjusting an inefficient antenna output.

In other words, the module control units 120a, 120b, and 120n generate the activation signal for determining the number of activated antenna units among the antenna units 100. In addition, the integrated control part 300 receives the activation signals generated by the module control parts 120a, 120b, and 120n, and controls the amount of power consumption of the transceiver connected to the phased array antennas 100a, 100b, and 100n based on the activation signal.

The communication part 400 may convert the voice and data generated by the mobile device 1 into a radio frequency (RF) signal, or convert the RF signal received from the phased array antenna modules 100a, 100b, and 100n into voice and data to output the voice and the data to the mobile device 1.

For example, the communication part 400 may be an individual or integrated chip including a modem, an RF transceiver, and the like configured to transmit and receive communication signals with external devices with the mobile device 1.

Referring to FIG. 3, the antenna unit 200 includes the first antenna electrode part 212, an insulating unit 211, the second antenna electrode part 250, and the sensing electrode part 240.

The first antenna electrode part 212 may transmit the first signal $S_1$ corresponding to the high frequency signal to the second antenna electrode part 250 by resonating a signal received from the outside.

At this time, the size of the first antenna electrode part 212 may be determined according to the wavelength of the signal to be received from the outside, and the first antenna electrode part 212 may be formed in various shapes, such as a rectangle and a circle, and made of a conductive material such as metal.

The insulating unit 211 is disposed between the first antenna electrode part 212 and the second antenna electrode part 250.

For example, the thickness of the insulating unit 211 may be formed to be 200 to 400 μm, and the insulating unit 211 may be made of an insulator material having low loss characteristics in a wide band and high frequency such as quartz or Teflon printed circuit board (PCB).

The second antenna electrode part 250 may be formed to be spaced apart from the first antenna electrode part 212.

The second antenna electrode part 250 is formed to be spaced apart from the first antenna electrode part 212, so that an electric charge may be accumulated between the first antenna electrode part 212 and the second antenna electrode part 250 to transmit and receive the second signal $S_2$ of the low frequency.

The second antenna electrode part 250 includes a transmission/reception area 251 and a signal transmission area 252.

The second antenna electrode part 250 includes the transmission/reception area 251 that transmits and receives the first signal $S_1$ and the second signal $S_2$ to and from the first antenna electrode part 212, and vertically overlaps the first antenna electrode part 212.

At this time, the width of the transmission/reception area 251 may be formed to be smaller than the width of the insulating unit 211, and formed to be smaller than or equal to the width of the first antenna electrode part 212.

The signal transmission area 252 is electrically connected to the sensing electrode part 240 and the module control part 120 to transmit the first signal $S_1$ and the second signal $S_2$.

At this time, the second signal $S_2$ is transmitted toward the sensing electrode part 240 through a node 247 to which the sensing electrode part 240 and the signal transmission area 252 are connected.

The sensing electrode part 240 may be electrically connected to the capacitance sensing part 110 and the second antenna electrode part 250, and the sensing electrode part 240 includes a filtering unit 241 and a sensing electrode unit 242.

The filtering unit 241 may be electrically connected to the second antenna electrode part 250 to block the first signal $S_1$ of a high-frequency signal, and pass through the second signal $S_2$ of a low-frequency signal.

The filtering unit 241 blocks the first signal $S_1$ of the high frequency, and pass through the second signal $S_2$ of the low frequency, so that it is possible to minimize the interaction between the first signal $S_1$ and the second signal $S_2$, and for example, the filtering unit 241 may be an RF choke.

The sensing electrode unit 242 is electrically connected to the filtering unit 241 and the capacitance sensing part 110 to transmit the second signal $S_2$.

At this time, the node 247 to which the sensing electrode part 240 and the second antenna electrode part 250 are connected, and the filtering unit 241 and the sensing electrode unit 242 of the sensing electrode part 240 may be disposed at a position spaced apart from the insulating unit 211, and the sensing electrode part 240 may be formed not to vertically overlap the insulating unit 211.

Meanwhile, a configuration in which the insulating unit 211 vertically overlaps the sensing electrode part 240 is also included in the embodiment of the present disclosure.

In other words, the insulating unit 211 may fully cover an upper surface of the antenna unit 200.

At this time, to suppress the generation of noise in the second signal $S_2$, that is, the low-frequency signal transmitted toward the sensing electrode part 240 due to the overlapping between the sensing electrode part 240 and the insulating unit 211, a separate means such as a shielding member or a filtering member may be added, or a correction control for suppressing the noise may be applied.

Figure 4:
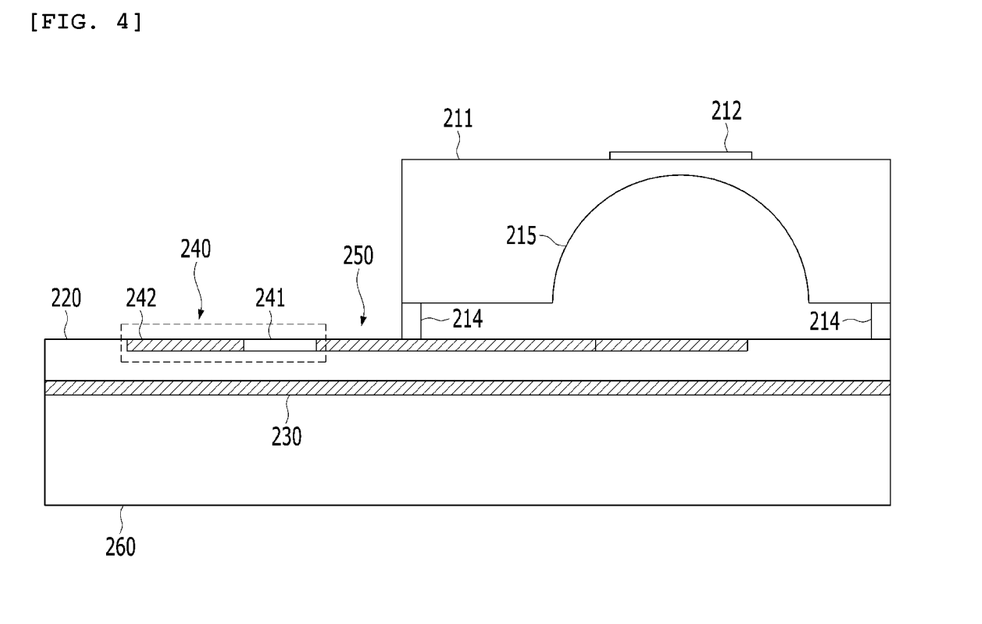
FIG. 4 is a cross-sectional view taken along line IV-IV in FIG. 3.

The capacitance sensing part 110 is connected to the sensing electrode part 240 to output the capacitance sensing signal $S_c$ by detecting at least one of the capacitance change between the first antenna electrode part 212 and the second antenna electrode part 250, the capacitance change between the first antenna electrode part 212 and the ground electrode part 230, and the capacitance change between the second antenna electrode part 250 and the ground electrode part 230 (see FIG. 4).

More specifically, based on the second signal $S_2$, the capacitance sensing part 110 detects at least one among the capacitance change between the first antenna electrode part 212 and the second antenna electrode part 250, the capacitance change between the first antenna electrode part 212 and the ground electrode part 230, and the capacitance change between the second antenna electrode part 250 and the ground electrode part 230 based on a difference between the time at which the voltage of the second signal $S_2$ reaches the reference voltage and the reference time, and the second signal $S_2$ is periodically transmitted to the capacitance sensing part 110.

The module control part 120 is electrically connected to the second antenna electrode part 250 of the antenna unit 100 to receive the first signal $S_1$.

A ground electrode unit 231 passes through an insulating substrate 270 or an insulating layer 220 at one end of the ground electrode part 230 to be described later, so that the end may be exposed to an upper surface of the insulating substrate 270 or the insulating layer 220.

Figure 5:
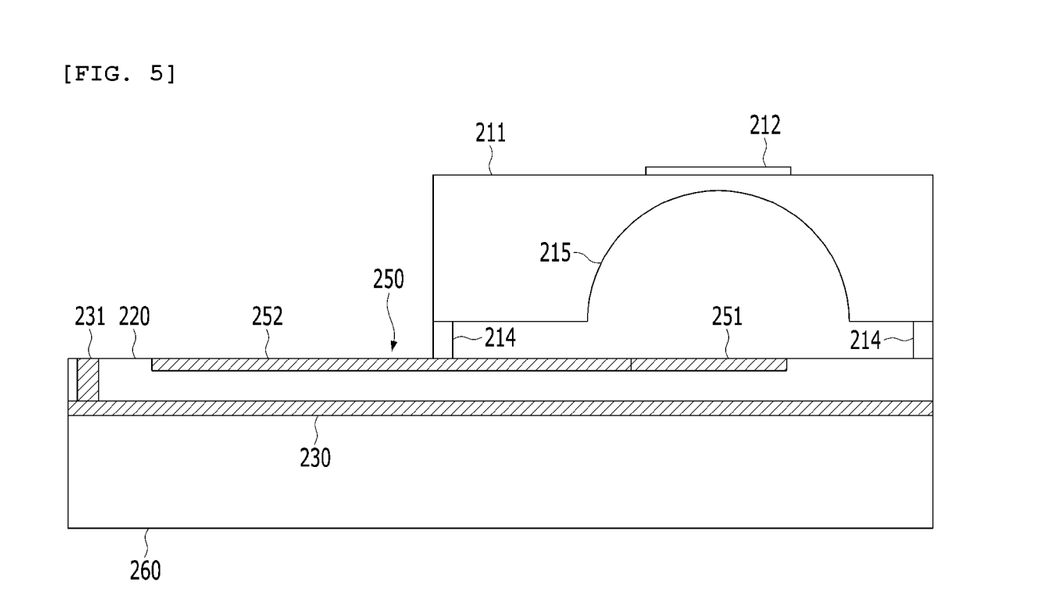
FIG. 5 is a cross-sectional view taken along line V-V in FIG. 3.

FIG. 4 is a cross-sectional view taken along line IV-IV in FIG. 3, and FIG. 5 is a cross-sectional view taken along line V-V in FIG. 3. Referring to FIGS. 4 and 5, the antenna unit 200 further includes a substrate 260, the ground electrode part 230, the insulating layer 220, and a support unit 214.

The substrate 260 may be formed of an insulator, and may be, for example, a quartz substrate or a glass substrate, which is formed in a plate shape, or may be made of a material having a dielectric constant of 5 or less with a small dielectric loss, and the substrate 260 may be formed by a method in which a circuit made of a metallic material is printed, deposited, or the like on the body.

The ground electrode part 230 may be formed on an upper surface of the substrate 260, and the ground electrode part 230 includes a ground electrode unit 231 that passes through the insulating layer 220 at one end of the ground electrode part 230 to have an end exposed to the upper surface of the insulating layer 220.

More specifically, the ground electrode part 230 may be formed in a plate shape or a patterned shape by performing a plating process and a patterning process on the upper surface of the substrate 260.

In addition, the ground electrode part 230 may be formed to be spaced apart from the first antenna electrode part 212 with the second antenna electrode part 250 interposed therebetween.

The insulating layer 220 is formed on an upper surface of the ground electrode part 230. The insulating layer 220 may be disposed above the ground electrode part 230, and formed at a height of 200 μm to 400 μm.

For example, the insulating layer 220 may be made of an insulator material having low loss characteristics in broadband and high frequency, such as quartz, benzocyclobutene (BCB), or Teflon printed circuit board (PCB).

By performing a patterning process on the upper surface of the ground electrode part 230, the upper surface of the insulating layer 220 is formed with the second antenna electrode part 250 and the sensing electrode part 240. The second antenna electrode part 250 and the sensing electrode part 240 may be formed, for example, by a general metal wire patterning process.

The support unit 214 may be disposed between the insulating layer 220 and the insulating unit 211, and may support the insulating unit 211 with respect to the insulating layer 220. At this time, the support unit 214 may allow the insulating unit 211 to be spaced apart from the upper surface of the insulating layer 220, and the transmission/reception area 251 may be surrounded by the support unit 214. In addition, the support unit 214 may be formed to cover a part of the second antenna electrode part 250.

At this time, the insulating unit 211 may be supported on an upper surface of the support unit 214.

For example, the support unit 214 may be made of an insulator material having low loss characteristics in broadband and high frequency, such as benzocyclobutene (BCB), and formed at a height of 10 μm to 30 μm.

The support unit 214 is disposed between the insulating unit 211 and the insulating layer 220 or between the second antenna electrode part 250 disposed on the upper surface of the insulating layer 220 and the insulating unit 211, so that it is possible to shield an inner space formed in the insulating unit 211 and the insulating layer 220 from the outside.

The first antenna electrode part 212 is disposed on the upper surface of the insulating unit 211, and a recess area 215 recessed upward from the insulating unit 211 is formed on a lower surface of the insulating unit 211. At this time, the first antenna electrode part 212 is formed to fully cover the transmission/reception area 251 of the second antenna electrode part 250.

At this time, the recess area 215 is disposed between the first antenna electrode part 211 and the second antenna electrode part 250. The recess area 215 may be formed to be round through various processes such as a wet etching or sandblasting process, but may be formed in an atypical shape.

For example, the recess area 215 may be formed at a depth of 150 μm to 200 μm from the lower portion of the insulating unit 211 in an upward direction.

An air layer is formed between the first antenna electrode part 212 and the second antenna electrode part 250 by the recess area 215, so that there is an advantage in that it is possible to secure a broad bandwidth.

The thickness of the insulating unit 211 may be formed to be the smallest at the center of the recess area 215, and may be increased from the center of the recess area 215 to an edge of the recess area 215.

Figure 6:
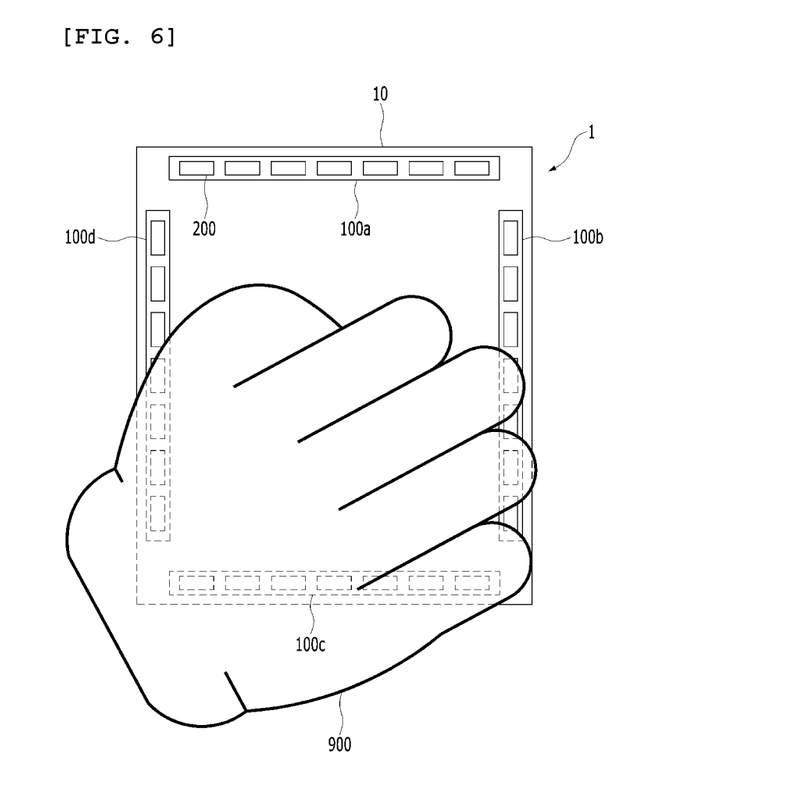
FIG. 6 is a view showing a state in which the mobile device in FIG. 1 comes into touch with an obstacle.

FIG. 6 is a view showing a state in which the mobile device in FIG. 1 touches an obstacle.

Referring to FIGS. 1 and 6, the phased array antenna modules 100a, 100b, 100c, and 100d are disposed to be spaced apart from each other at different positions on the body part 10 of the mobile device 1.

FIG. 6 shows the phased array antenna module 100c fully covered by an obstacle 900, the phased array antenna modules 100b and 100d partially covered by the obstacle 900, and the phased array antenna module 100a not covered by the obstacle 900.

For example, the obstacle 900 may be an object in which an electric charge may be applied to at least one among between the first antenna electrode part 212 and the second antenna electrode part 250, between the first antenna electrode part 212 and the ground electrode part 230, and between the second antenna electrode part 250 and the ground electrode par 230 of the antenna unit 200 such as a hand gripping the mobile device 1.

At this time, in each of the antenna units 200 of the phased array antenna modules 110b and 110c covered by the obstacle 900, the capacitance sensing part 110 detects at least one among the capacitance change between the first antenna electrode part 212 and the second antenna electrode part 250, the capacitance change between the first antenna electrode part 212 and the second antenna electrode part 230, and the capacitance change between the second antenna electrode part 250 and the ground electrode part 230 through the touch with the obstacle 900 to generate the individual capacitance sensing signal $S_c$.

At this time, based on the individual capacitance sensing signal $S_c$, the module control part 120 may deactivate the transmission/reception signal or power of the antenna unit covered by the obstacle 900 or amplify and control the outputs of the transmission/reception signals of the antenna units other than the antenna unit obscured by the obstacle 900.

In other words, in the antenna unit 200 of the phased array antenna module 100c fully covered by the obstacle 900, the module control unit 120 of the phased array antenna module 100c may control all of the antenna units 200 of the phased array antenna module 100c to be deactivated based on the capacitance sensing signal $S_c$ generated by the capacitance sensing part 110 of the phased array antenna module 100c.

The integrated control part 300 may control the phased array antenna module 100a not covered by the obstacle 900 to transmit and receive a signal amplified compared to other phased array antenna modules.

More specifically, the integrated control part 300 of the mobile device 1 may selectively deactivate the outputs of the phased array antenna modules 100a, 100b, 100c, and 100d based on the activation signal SA generated by the phased array antenna modules 100a, 100b, 100c, and 100d, and amplify the outputs of the other non-deactivated phased array antenna modules when the output of at least one phased array antenna module is deactivated.

For example, the phased array antenna module 100a not covered by the obstacle 900 receives a higher output from the integrated control part 300 than those of the phased array antenna modules 100b and 100d partially covered by the obstacle 900 or deactivates the phased array antenna module 100c fully covered by the obstacle 900, so that it is possible to enable communication through the phased array antenna module that enables smooth communication.

In the proposed embodiment, there is an advantage in that it is possible to detect the reduction in the transmission/reception sensitivity of the antenna simply through the capacitance change without a separate touch sensor configured to detect the hand grip or a separate output detection configuration for detecting the reduction in reception sensitivity of a specific antenna unit or antenna module.

In addition, the reduction in reception sensitivity may be detected in a unit of antenna unit, so that there is an advantage in that it is possible to individually perform a control such as deactivation of the antenna unit or the antenna module having the reduced transmission/reception sensitivity.

In addition, there is an advantage in that it is possible to obtain the optimal transmission/reception sensitivity by controlling the magnitude of the output to another antenna unit or antenna module in which the reception sensitivity is not reduced.

Figure 7:
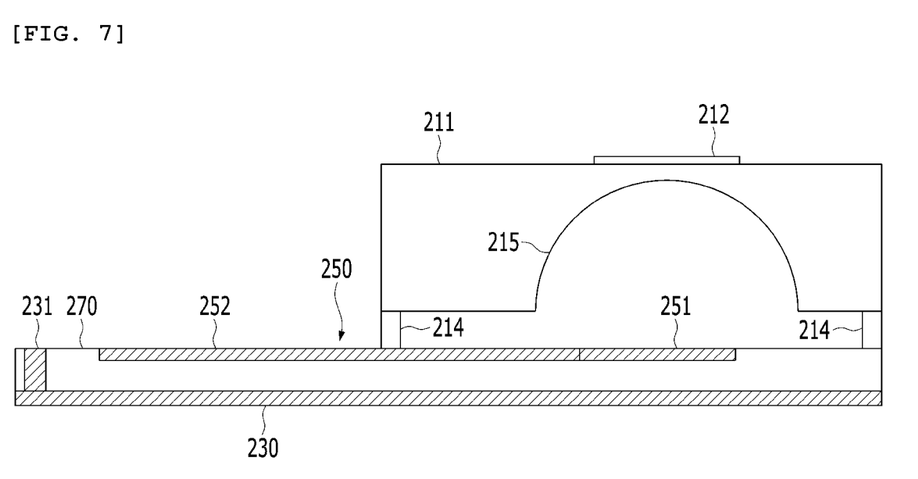
FIG. 7 is a cross-sectional view of an antenna unit according to another embodiment of the present disclosure.

FIG. 7 is a cross-sectional view of an antenna unit according to another embodiment of the present disclosure.

Since there is a difference in the antenna unit according to this embodiment in terms of configurations of the substrate, the ground electrode part, the insulating substrate, and the support unit of the antenna unit but the antenna unit has the same configurations as those of the antenna units of FIGS. 1 to 6 in terms of the other configurations, differential features of this embodiment will be mainly described below.

Referring to FIG. 7, the antenna unit 200 according to this embodiment includes the ground electrode part 230, the sensing electrode part 240, and the insulating substrate 270 disposed between the second antenna electrode part 250 and the support unit 214.

At this time, the ground electrode part 230 is disposed on the lowermost surface of the antenna unit 200, and the ground electrode part 230 may include the ground electrode unit 231 that passes through the insulating substrate 270 at one end of the ground electrode part 230 to have the end exposed to the upper surface of the insulating substrate 270. The ground electrode unit 231 may be formed by drilling a part of the insulating substrate 270 to form a via, and then depositing a metallic material inside the via.

In addition, the insulating substrate 270 may be disposed above the ground electrode part 230. The insulating substrate 270 may be formed at a thickness of 250 μm to 500 μm, and the insulating substrate 270 may be made of an insulator material having low loss characteristics in broadband and high frequency such as quartz, benzocyclobutene (BCB), or Teflon printed circuit board (PCB) having a preset rigidity.

The second antenna electrode part 250 and the sensing electrode part 240 are formed on the upper surface of the insulating substrate 270.

The support unit 214 may be disposed between the insulating substrate 270 and the insulating unit 211 and may support the insulating unit 211 with respect to the insulating substrate 270.

In the proposed embodiment, there are advantages in that it is possible to reduce the overall height of the antenna unit 200, and it is possible to secure the structural stability of the antenna unit 200 by disposing the insulating substrate 270 made of a rigid material between the ground electrode part 230 and the sensing electrode part 240 and between the second antenna electrode part 250 and the support unit 214. In addition, there is an advantage in that it is possible to secure the height of the insulating substrate 270 to a preset size in a structurally stable state.

Figure 8:
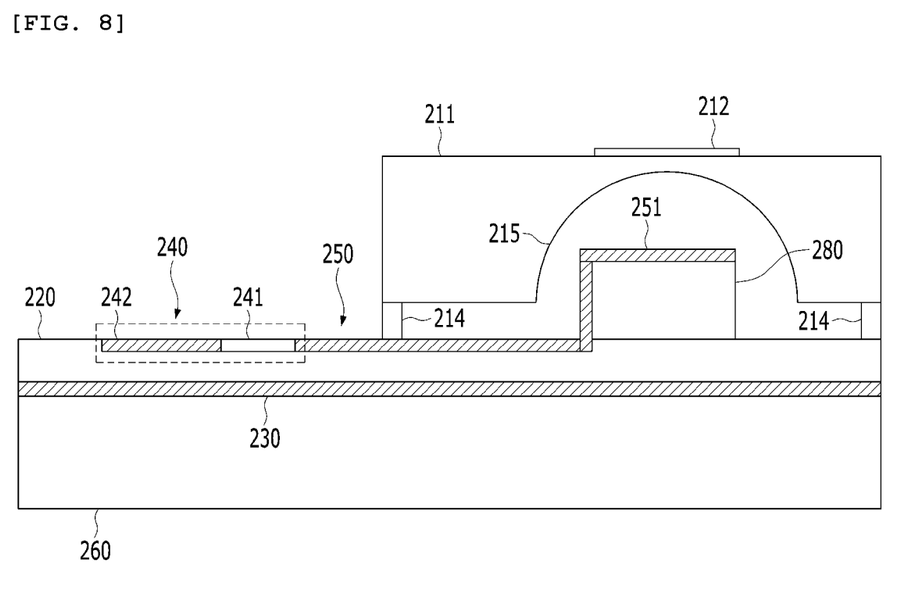
FIG. 8 is a cross-sectional view of an antenna unit according to still another embodiment of the present disclosure.

FIG. 8 is a cross-sectional view of an antenna unit according to still another embodiment of the present disclosure.

In this embodiment, since there is a difference only in the configuration of an additional insulating area of the antenna unit and the other configurations are the same as those of the antenna units of FIGS. 1 to 6, differential features of this embodiment will be mainly described below.

Referring to FIG. 8, the transmission/reception area 251 of the second antenna electrode part 250 is formed in a shape that is bent upward than other areas of the second antenna electrode part 250 other than the transmission/reception area 251.

At this time, the transmission/reception area 251 of the second antenna electrode part 250 may be spaced apart from the recessed lower surface of the insulating unit 211 in a state of being positioned in the recess area 215 of the insulating unit 211.

An additional insulating area 280 may be formed between the transmission/reception area 251 of the second antenna electrode part 250 and the insulating layer 220, and is formed so that the dielectric constant of the additional insulating area 280 is lower than that of the second antenna electrode part 250.

For example, the additional insulating area 280 may be an air gap configured to separate the transmission/reception area 251 from the insulating layer 220.

An electrode gap between the first antenna electrode part 212 and the second antenna electrode part 250 is formed to be narrow, so that there are advantages in that it is possible to increase a capacitance generated between the first antenna electrode part 212 and the second antenna electrode part 250, the second signal $S_2$ generated from the increased capacitance may be clearly detected by the capacitance sensing part 110, and the broadband impedance matching is easy.

Figure 9:
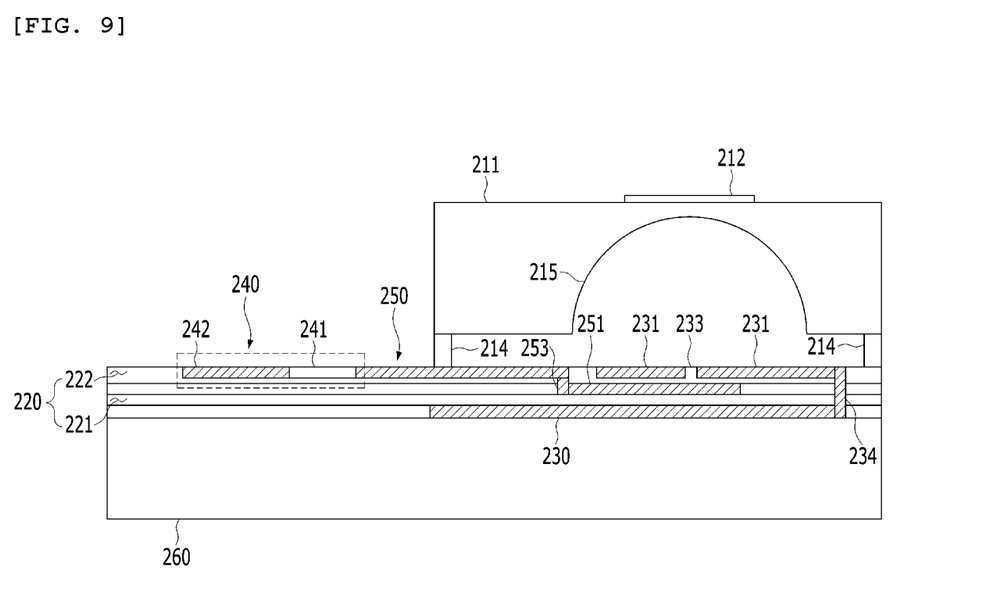
FIG. 9 is a cross-sectional view of an antenna unit according to yet another embodiment of the present disclosure.

FIG. 9 is a cross-sectional view of an antenna unit according to yet another embodiment of the present disclosure.

In this embodiment, since there is a difference only in the configurations of the ground electrode part, the insulating part, and the second electrode part of the antenna unit and the other configurations are the same as those of the antenna units in FIGS. 1 to 5, differential features of this embodiment will be mainly described below.

Referring to FIG. 9, the ground electrode part 230 may be formed on an upper surface of the substrate 260 of an insulator, and the insulating layer 220 may be formed on an upper surface of the ground electrode part 230.

At this time, the insulating layer 220 of the antenna unit 200 includes a first sub-insulating layer 221 and a second sub-insulating layer 222.

More specifically, the first sub-insulating layer 221 is disposed on the upper surface of the ground electrode part 230. At this time, the transmission/reception area 251 of the second antenna electrode part 212 may be disposed on an upper surface of the first sub insulating layer 221.

The second sub-insulating layer 222 may be disposed on the upper surface of the transmission/reception area 251 of the second antenna electrode part 250, and the signal transmission area 252 of the second antenna electrode part 250 may be disposed on an upper surface of the second sub-insulating layer 222.

The first sub-insulating layer 221 and the second sub-insulating layer 222 may be made of an insulator material having low loss characteristics in broadband and high frequency, such as quartz, benzocyclobutene (BCB), or Teflon printed circuit board (PCB).

The insulating layer 220 may further include a second antenna electrode part 250 side bent area 253.

At this time, the bent area 253 may be formed to be bent in a shape passing through the second sub-insulating layer 222 at the end of the signal transmission area 252 of the second antenna electrode part 250 and connected to the transmission/reception area 251.

The ground electrode part 230 may further include a sub-ground electrode 231 and a connection line 234.

The sub-ground electrode 231 may vertically overlap the transmission/reception area 251 of the second antenna electrode part 250 disposed between the first sub-insulating layer 221 and the second sub-insulating layer 222 in a state of being disposed on the upper surface of the second sub-insulating layer 222, a through hole 233 may be formed, and a part of the second sub-insulating layer 222 may be exposed upward through the through hole 233.

The connection line 234 may pass through the first sub-insulating layer 221 and the second sub-insulating layer 222 to connect the sub-ground electrode 231 and a main ground electrode 234 of the ground electrode part 230.

In the proposed embodiment, the unwanted emission generated from the second antenna electrode part 250 is shielded by disposing the sub-ground electrode 231 having the through hole 233 formed therein between the first antenna electrode part 212 and the transmission/reception area 251 of the second antenna electrode part 250, so that it is possible to acquire an accurate signal.

Figure 10:
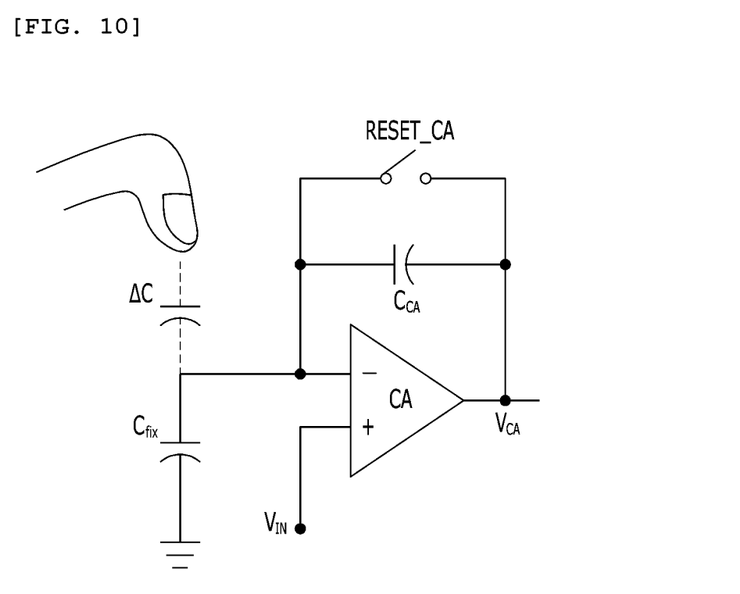
FIG. 10 is a view showing a circuit configuration of a capacitance sensing part of the antenna unit according to still another embodiment of the present disclosure.
Figure 11:
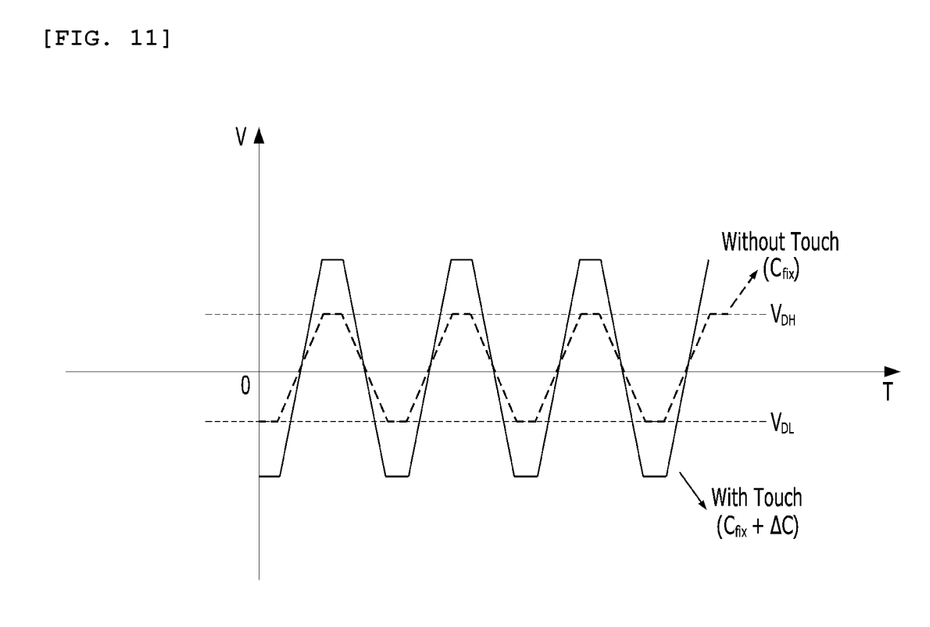
FIG. 11 is a view showing a change according to a time of a second signal detected by the capacitance sensing part in FIG. 10.

FIG. 10 is a view showing a circuit configuration of a capacitance sensing part of the antenna unit according to still another embodiment of the present disclosure, and FIG. 11 is a view showing a change according to a time of a second signal detected by the capacitance sensing part in FIG. 10.

Since the configuration of the capacitance sensing part of the antenna unit according to the embodiment of the present disclosure is different only in the configuration in which the second signal is a voltage signal, and the other configurations are substantially the same as those of the antenna units of FIGS. 1 to 6, the characteristic parts of this embodiment will be mainly described below.

Referring to FIGS. 10 and 11, the capacitance sensing part 110 of the antenna unit 100 of the phased array antenna module according to the embodiment of the present disclosure may detect the capacitance change of the antenna unit 100 including at least one among the capacitance changes between the first antenna electrode part 212 and the second antenna electrode part 250, between the first antenna electrode part 212 and the ground electrode part 230, and between the second antenna electrode part 250 and the ground electrode part 230 by applying a reference voltage signal $V_{IN}$ to a charge amplifier non-inverted terminal to identify the size of a charge amplifier output signal $V_{CA}$ based on the second signal $S_2$ formed as the voltage signal. At this time, the second signal $S_2$ is periodically transmitted toward the capacitance sensing part 110.

In other words, when a part of the user's body or the like touches the antenna unit 100 and thus a capacitance value is increased (increase capacitance ΔC) compared to a preset capacitance $C_{fix}$ of the antenna unit 100, the output signal $V_{CA}$ is increased compared to a case in which the obstacle does not touch the antenna unit 100 based on the second signal $S_2$ that is the voltage signal periodically transmitted. In addition, the capacitance sensing part 110 determines whether the obstacle touches the antenna unit 100 based on the increased charge amplifier output signal $V_{CA}$.

Below is an equation showing the relationship between the capacitance change and the output signal $V_{CA}$.

$$V_{CA} = \left(1 + \frac{C_{fix} + \Delta C}{C_{CA}}\right) V_{IN} \qquad \text{Equation 1}$$

FIG. 11 shows the amount of change of the periodic charge amplifier output signal $V_{CA}$ when the obstacle such as the user's hand touches the antenna unit 100 and when the obstacle does not touch the antenna unit 100. The maximum value of the charge amplifier output signal $V_{CA}$ in the state in which the obstacle has been touched is formed to be greater than the maximum value of the charge amplifier output signal $V_{CA}$ in a normal state, that is, the state in which the obstacle has not been touched, and based on this, the capacitance sensing unit 110 may determine the touch between the obstacle and the antenna unit 100 and the reduction in sensitivity accordingly.

While the preferred embodiments of the present disclosure have been described above, the present disclosure is not limited thereto, and may be variously modified and embodied within the scopes of the claims and the detailed description and accompanying drawings of the disclosure, and it goes without saying that this also belongs to the scope of the present disclosure.

The invention claimed is:

1. A phased array antenna module comprising:
a plurality of antenna units including a first antenna electrode part, a second antenna electrode part spaced apart from the first antenna electrode part, a sensing electrode part electrically connected to the second antenna electrode part, and a ground electrode part spaced apart from the first antenna electrode part with the second antenna electrode part interposed therebetween;
a capacitance sensing part connected to the sensing electrode part to output a capacitance sensing signal by detecting at least one of a capacitance change between the first antenna electrode part and the second antenna electrode part, a capacitance change between the first antenna electrode part and the ground electrode part, and a capacitance change between the second antenna electrode part and the ground electrode part; and
a module control unit electrically connected to the capacitance sensing part and the second antenna electrode part of the antenna unit, and configured to control the antenna units based on the capacitance sensing signal generated from the capacitance sensing part,
wherein the first antenna electrode part and the second antenna electrode part form a single signal path.

2. The phased array antenna module of claim 1, wherein the sensing electrode part includes:
a filtering unit electrically connected to the second antenna electrode part to block a first signal of a high frequency signal, and pass a second signal of a low frequency signal;
and a sensing electrode unit electrically connected to the filtering unit and the capacitance sensing part, and configured to transmit the second signal.

3. The phased array antenna module of claim 2, wherein the filtering unit is an RF choke.

4. The phased array antenna module of claim 2, wherein the antenna unit includes an insulating unit disposed between the first antenna electrode part and the second antenna electrode part, and
the first antenna electrode part is disposed on an upper surface of the insulating unit, a recess area recessed upward from the insulating unit is formed on a lower surface of the insulating unit, and the thickness of the insulating unit is formed to be the smallest at a center of the recess area and is increased from the center of the recess area toward an edge of the recess area.

5. The phased array antenna module of claim 4, wherein the second antenna electrode part includes a transmission/reception area that transmits and receives the first signal and the second signal to and from the first antenna electrode part, and vertically overlaps the first antenna electrode part, and a signal transmission area electrically connected to the sensing electrode part and the module control part to transmit the first signal and the second signal,
the second signal is transmitted toward the sensing electrode part through a node at which the sensing electrode part and the signal transmission area are connected, and the recess area is disposed between the first antenna electrode part and the second antenna electrode part.

6. The phased array antenna module of claim 5, wherein the first antenna electrode part is formed to have an area larger than that of the transmission/reception area of the second antenna electrode part, and
the first antenna electrode part fully covers the transmission/reception area of the second antenna electrode part.

7. The phased array antenna module of claim 6, wherein the antenna unit further includes a substrate having the ground electrode part formed on an upper surface, an insulating layer disposed above the ground electrode part, and a support unit disposed between the insulating layer and the insulating unit and configured to support the insulating unit with respect to the insulating layer,
the support unit is formed so that the insulating unit is spaced apart from the upper surface of the insulating layer, and
the transmission/reception area is surrounded by the support unit.

8. The phased array antenna module of claim 7, wherein the second antenna electrode part and the sensing electrode part are formed on the upper surface of the insulating layer, and
the support unit covers a part of the second antenna electrode part.

9. The phased array antenna module of claim 8, wherein the transmission/reception area of the second antenna electrode part is formed in a bent shape upward more than other areas of the second antenna electrode part other than the transmission/reception area,
an additional insulating area is formed between the transmission/reception area of the second antenna electrode part and the insulating layer,
the transmission/reception area of the second antenna electrode part is spaced apart from the recessed lower surface of the insulating unit in a state of being positioned within the recess area of the insulating unit, and
a dielectric constant of the additional insulating area is lower than a dielectric constant of the second antenna electrode part.

10. The phased array antenna module of claim 9, wherein the additional insulating area is an air gap configured to separate the transmission/reception area from the insulating layer.

11. The phased array antenna module of claim 7, wherein the ground electrode part includes a ground electrode unit that passes through the insulating layer at one end of the ground electrode part to have an end exposed to the upper surface of the insulating layer.

12. The phased array antenna module of claim 7, wherein the insulating layer includes a first sub-insulating layer disposed on an upper surface of the ground electrode part, and having the transmission/reception area of the second antenna electrode part disposed on an upper surface, and a second sub-insulating layer disposed on an upper surface of the transmission/reception area,
the signal transmission area of the second antenna electrode part is disposed on an upper surface of the second sub-insulating layer,
the phased array antenna module further includes a second antenna electrode part side bent area formed to be bent in a shape of passing through the second sub-insulating layer at an end of the signal transmission area of the second antenna electrode part and connected to the transmission/reception area, and the ground electrode part further includes a sub-ground electrode vertically overlapping the transmission/reception area of the second antenna electrode part disposed between the first sub-insulating layer and the second sub-insulating layer in a state of being disposed on the upper surface of the second sub-insulating layer, and formed with a through hole, and a part of the second sub-insulating layer is exposed upward through the through hole.

13. The phased array antenna module of claim 12, wherein the ground electrode part further includes a connection line connecting the sub-ground electrode and a main ground electrode of the ground electrode part by passing through the first sub-insulating layer and the second sub-insulating layer.

14. The phased array antenna module of claim 6, wherein the antenna unit further includes an insulating substrate disposed above the ground electrode part, and a support unit disposed between the insulating substrate and the insulating unit and configured to support the insulating unit with respect to the insulating substrate, and the support unit is formed so that the insulating unit is spaced apart from the upper surface of the insulating substrate, the transmission/reception area is surrounded by the support unit, and the thickness of the insulating substrate is 250 um to 500 um.

15. The phased array antenna module of claim 2, wherein the capacitance sensing part detects at least one among a capacitance change between the first antenna electrode part and the second antenna electrode part, and capacitance changes between the first antenna electrode part and the ground electrode part and between the second antenna electrode part and the ground electrode part by identifying a time at which a current source charges a capacitor and the charged voltage reaches a specific reference voltage based on the second signal formed as a current signal, and the second signal is periodically transmitted to the capacitance sensing part.

16. The phased array antenna module of claim 2, wherein the capacitance sensing part detects at least one among a capacitance change between the first antenna electrode part and the second antenna electrode part, and capacitance changes between the first antenna electrode part and the ground electrode part and between the second antenna electrode part and the ground electrode part by applying a reference voltage signal to a charge amplifier non-inverted terminal and identifying the magnitude of a charge amplifier output signal based on the second signal formed as a voltage signal, and the second signal is periodically transmitted to the capacitance sensing part.

17. The phased array antenna module of claim 15, wherein the module control unit deactivates the corresponding antenna unit when a capacitance value measured by the capacitance sensing part of any one or more antenna units is different from a reference capacitance value based on the capacitance sensing signal received from a plurality of antenna units.

18. A mobile device comprising:
a body part forming an external shape; and
a plurality of phased array antenna modules disposed inside the body part and including a first antenna electrode part, a second antenna electrode part spaced apart from the first antenna electrode part, a sensing electrode part electrically connected to the second antenna electrode part, a plurality of antenna units including a ground electrode part spaced apart from the first antenna electrode part with the second antenna electrode part interposed therebetween, a capacitance sensing part connected to the sensing electrode part to output a capacitance sensing signal by detecting at least one among a capacitance change between the first antenna electrode part and the second antenna electrode part, a capacitance change between the first antenna electrode part and the ground electrode part, and a capacitance change between the second antenna electrode part and the ground electrode part, and a module control part electrically connected to the capacitance sensing apart and the second antenna electrode part of the antenna unit, and configured to control the antenna units based on the capacitance sensing signal generated from the sensing part,
wherein the first antenna electrode part and the second antenna electrode part form a single signal path, and
wherein the phased array antenna modules are disposed to be spaced apart from each other at different positions of the body part.

19. The mobile device of claim 18, further comprising: an integrated control part electrically connected to the module control part to control the amount of the power consumption of a transceiver connected to the phased array antenna modules, wherein
the module control part generates an activation signal for determining the number of activated antenna units among the antenna units, and
the integrated control part receives the activation signal generated from the module control part, and controls the amount of the power consumption of the transceiver connected to the phased array antenna modules based on the activation signal.

20. The phased array antenna module of claim 16, wherein the module control unit deactivates the corresponding antenna unit when a capacitance value measured by the capacitance sensing part of any one or more antenna units is different from a reference capacitance value based on the capacitance sensing signal received from a plurality of antenna units.

* * * * *